United States Patent [19]

Jenks

[11] 4,238,723

[45] Dec. 9, 1980

[54] POWER CONTROL SYSTEM

[76] Inventor: William C. Jenks, 9637 Lemon Ave., Alta Loma, Calif. 91701

[21] Appl. No.: 856,010

[22] Filed: Nov. 30, 1977

[51] Int. Cl.³ ............................................. G05F 1/455
[52] U.S. Cl. .................................... 323/24; 307/228;
323/21; 323/34; 323/75 F
[58] Field of Search .................... 307/228, 252 T, 261;
323/18, 21, 22 SC, 24, 34, 75 F

[56] References Cited

U.S. PATENT DOCUMENTS

| 2,682,640 | 6/1954 | Harling | 323/75 F |
|---|---|---|---|
| 3,697,777 | 10/1972 | Donoghue | 307/228 |
| 3,706,913 | 12/1972 | Malatchi | 323/24 X |
| 4,023,122 | 5/1977 | Oura | 307/261 X |
| 4,068,157 | 1/1978 | Bassett | 323/24 X |
| 4,117,392 | 9/1978 | Kintigh et al. | 323/21 |

OTHER PUBLICATIONS

Electronics, Mar. 4, 1976, pp. 112–114.

Instruments & Control Systems, Dec. 1972, p. 48.

Primary Examiner—A. D. Pellinen
Attorney, Agent, or Firm—Harvey S. Hertz

[57] ABSTRACT

A system for controlling AC power for any load in which it is desired to limit and/or specifically program current at least for an initial period. SCR switches are employed, these being controlled as to angle of conduction out of the 180 degrees of each AC half cycle. The positive and negative half cycles are separated in a diode bridge and are separately handled throughout to the SCR's, which are connected two in parallel, in opposing polarity per phase. Voltage ramps are generated for each half cycle and a comparison circuit acts as a pick-off to start the SCR gate at a point in the half cycle determined by the comparator reference, the latter being the independent control. Fast turn-on leading edge spikes on the SCR gates are provided to minimize SCR di/dt stress.

19 Claims, 10 Drawing Figures

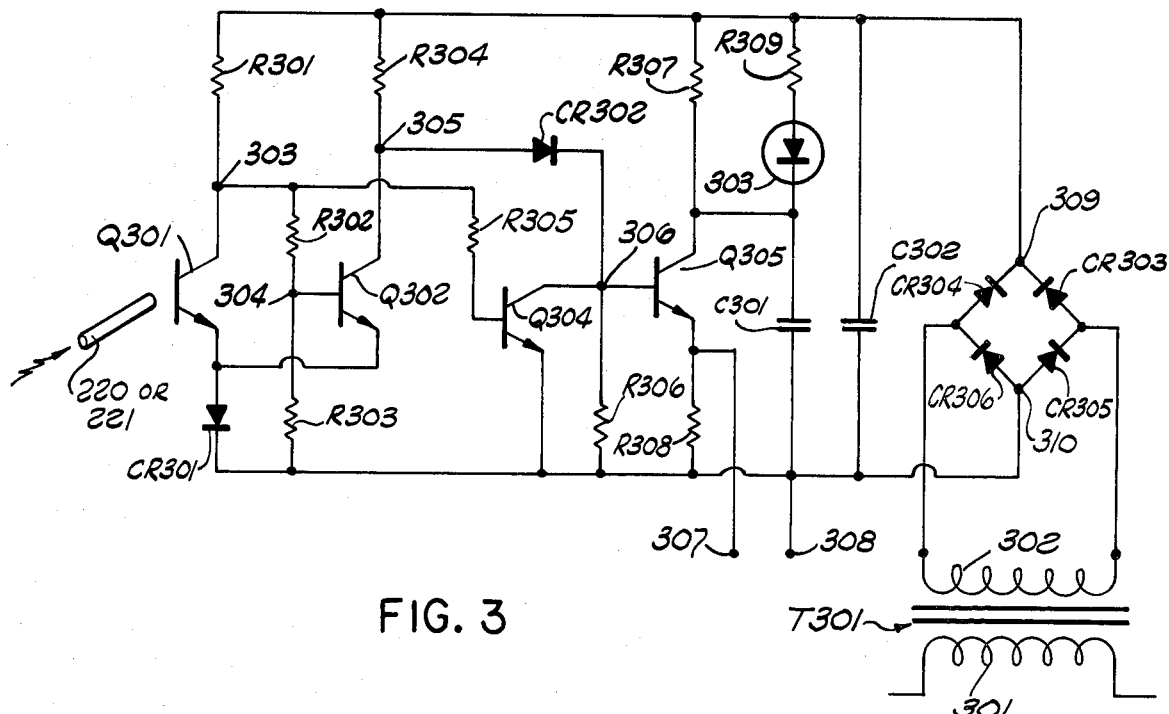
FIG. 3
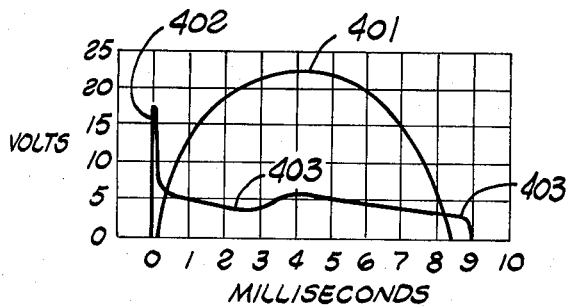
FIG. 4 GATE VERSUS ANODE VOLTAGE FIRING RELATIONSHIP
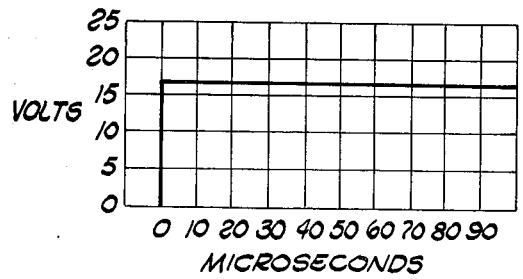
FIG. 5 EXPANDED PORTION OF GATE VOLTAGE SHOWN AT 180° CONDUCTION ANGLE.
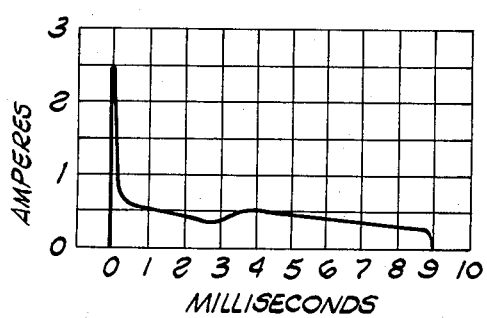
FIG. 6 GATE CURRENT WITH 1 OHM LOAD AT 180° CONDUCTION ANGLE
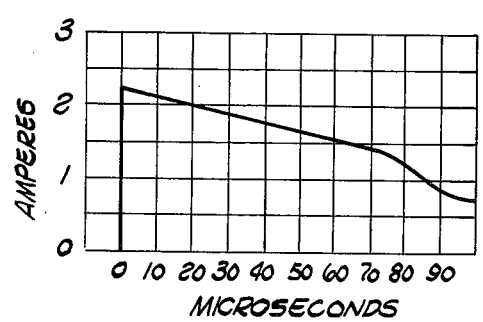
FIG. 7 EXPANDED PORTION OF GATE CURRENT WITH 1 OHM LOAD SHOWN AT 180° CONDUCTION ANGLE.

FIG. 8
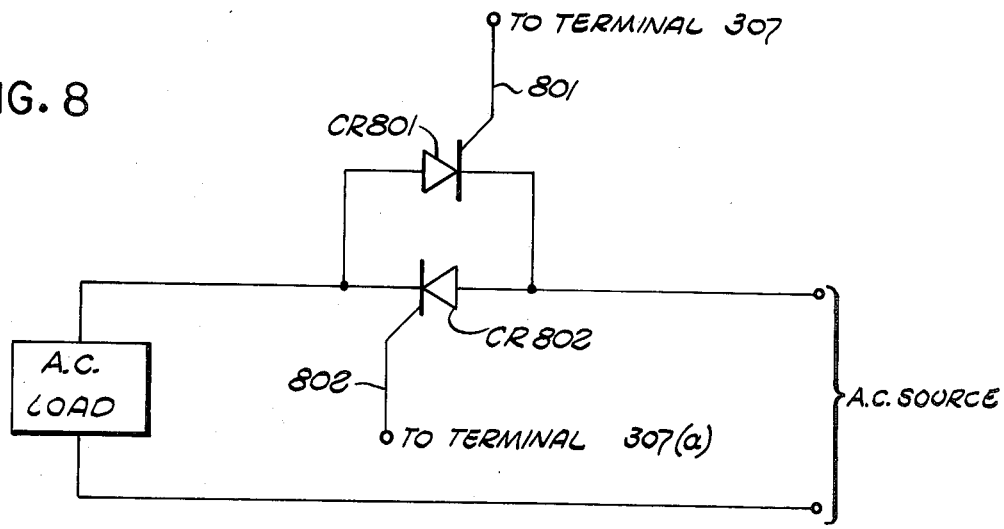
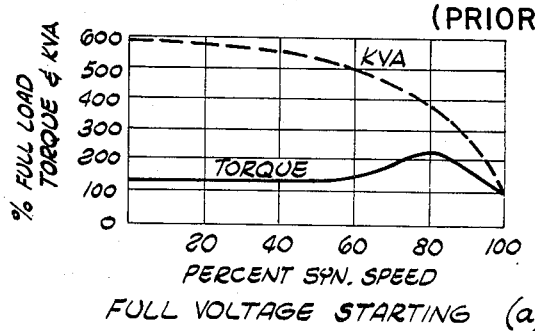
FULL VOLTAGE STARTING (a)
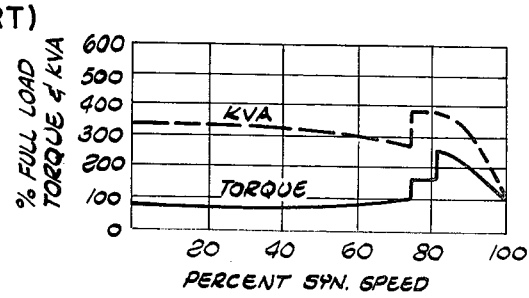
AUTO-TRANS. STARTING (b)
closed transition
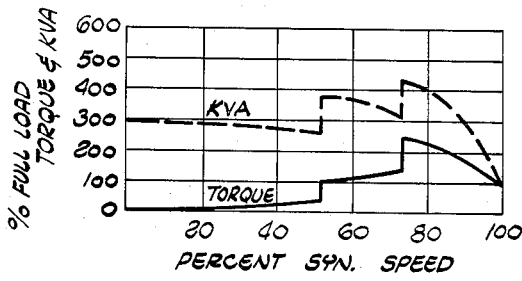
SERIES RESISTANCE STARTING (c)
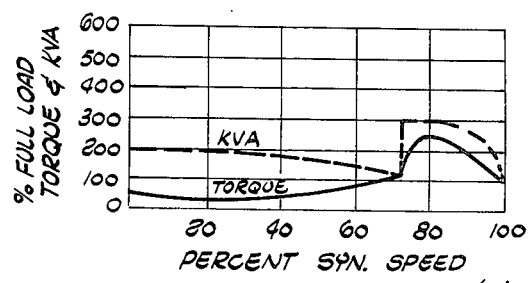
WYE-DELTA STARTING (d)
FIG. 9
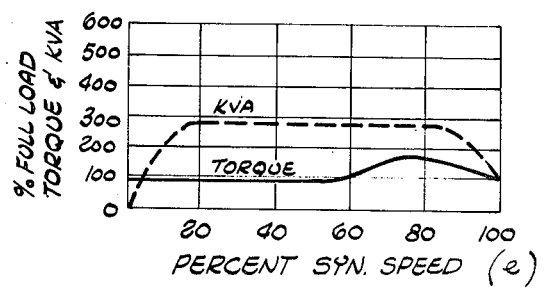

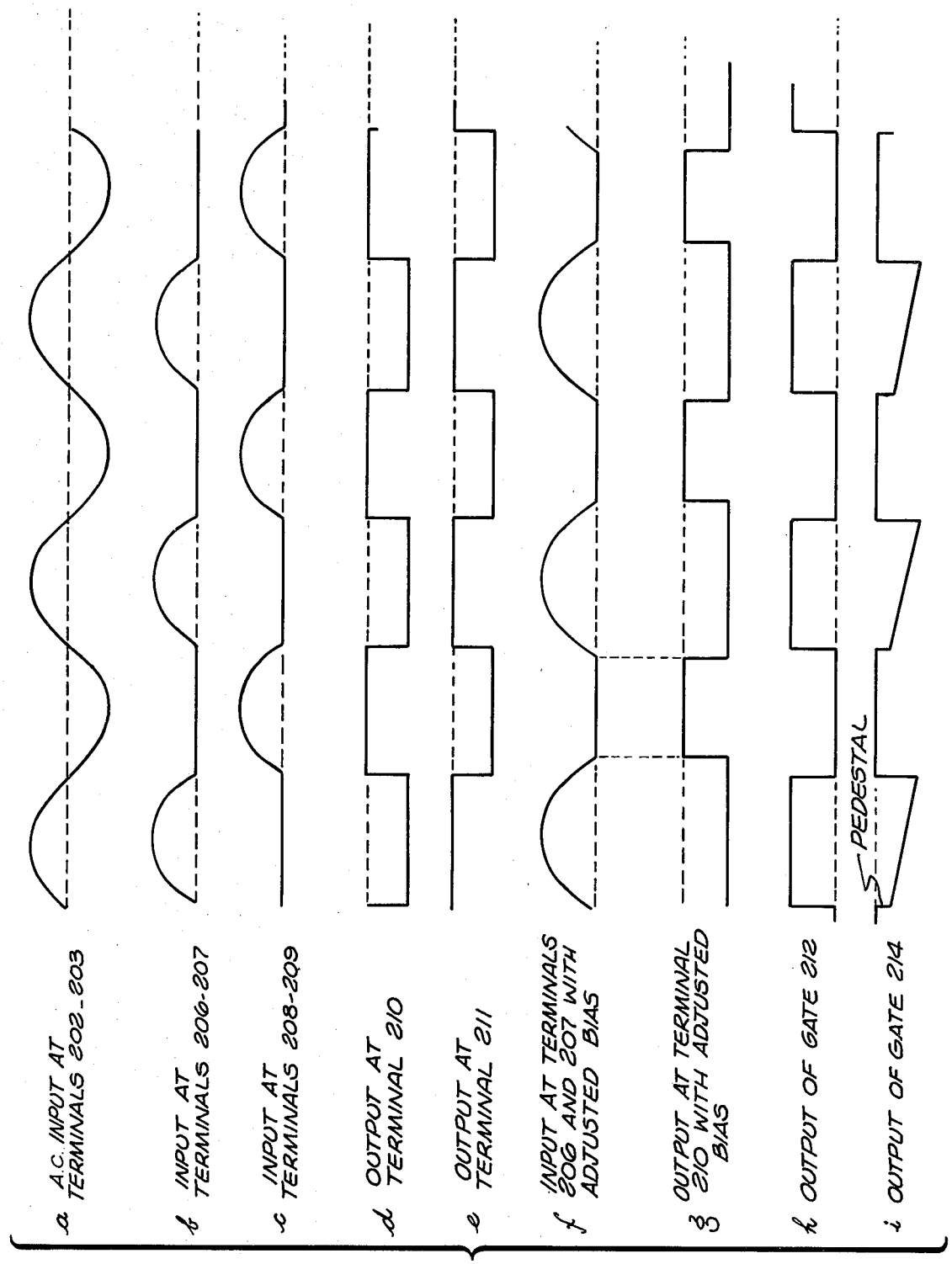

POWER CONTROL SYSTEM

BACKGROUND OF THE INVENTION (1) Field of the Invention

The invention relates generally to a power control system between source and load as a function of an independent control system.

(2) Description of the Prior Art

When starting multiphase AC induction motors, it is desirable to start the motor with the highest possible torque and with a minimum KVA (kilovolt-ampere) power input. Solid state control circuits have been utilized incorporating SCR's which phase control the AC input power, thus providing high instantaneous power and enabling high starting torques to be achieved. However, in these circuits, it still is necessary to start the motor with the input AC voltage at a high phase angle in order to prevent loss of phase synchronization caused by line noise generating a false signal.

Induction motors, as is well known, run at a full speed which is less than synchronous speed of a truly synchronous motor of the same number of poles at the same power source frequency. This "slip" in speed is related to the torque developed and the load presented as well as to various design factors, although it is seldom more than four or five percent under the corresponding synchronous speed. Nearly all induction motors of more than a few horsepower are three phase units.

Alternate starting techniques and apparatus include full line voltage starting which is applicable to only single and poly phase motors of relatively small horsepower, and a variety of controlled starting devices for reducing the applied voltage at least for a small initial acceleration period.

The controlled starting devices of the prior art include auto-transformer starting, series resistance starting with one or more resistance steps before the full power run condition, and wye-delta switched starting. In the auto-transformer arrangement, the supply voltage, and therefore the KVA input is reduced manually or on a preprogrammed basis until the motor reaches a speed on the order of seventy-five percent of full speed. At that time, the load is effectively cut-over to full voltage. Initial KVA may be only about three times the rated running KVA, but tends to surge to a higher value once the full line voltage is applied. Series resistance starting produces surges at each switching to a lower value of resistance as does the wye-delta configuration when going from delta to wye load connection. That system employs the phase legs of the load first in a wye connection which reduces the initial period KVA to about one third of that resulting from full voltage starting but produces transient demand when the load legs are switched to the delta configuration. Wye-delta and series resistance starting torques are particularly low as compared to auto-transformer starting.

The full voltage starting technique and any of the other aforementioned prior art arrangements including mode switching (stepping) produce mechanical shock in the motor and driven mechanical apparatus, which can have undesirable impact on equipment life and operational effectiveness.

The cost of starting equipment and its maintenance is also a factor in the prior art systems, even the full voltage start systems, because of the required large oversizing of contactors required for all but very small motors. Mechanical switching and programmers are not only expensive to build, but also costly to repair when they malfunction. Motor burn-out because of excessive starting load is also a factor in motor starting design, and cannot be readily dealt with in the aforementioned prior art devices.

Still further, control of electric demand consistent with adequate starting torque, and avoidance of large transient demands from the power system are important from an economic point of view both as an internal wiring matter, but also because of power utility demand-based power rates.

Although solid state motor control devices are known, they do not include automatic motor acceleration "tracking" to provide adequate torque characteristics and to provide a relatively flat KVA demand during starting along with a relatively flat torque curve during acceleration.

SUMMARY OF THE INVENTION

In accordance with the state of the prior art, it may be said to have been the general objective of the present invention to produce a novel, solid-state, electronic controller suitable which can be programmed or controlled in analog fashion, and which provides simple and economical circuitry for the purpose.

Alternate half-cycles of an AC input signal are inherently time-phased, 180 electrical degrees and are handled in separate channels. The aforementioned alternate half-cycles are first formed into separate trains of square waves which are converted to corresponding separate pulse sawtooth signal trains. Comparators act as pick-off devices to initiate the corresponding series of gates of variable duration depending on the reference (external control) signal amplitude against which said comparators function. Those variable gates control SCR electrical firing angle. A power amplifier is provided for each channel to produce the required drive for SCR gate electrodes. Since the SCR's are usually operating at relatively high voltages, optical isolators couple the variable gate signals to the power amplifiers, the latter being adapted to "float" electrically.

The power amplifiers introduce leading edge spikes for SCR "hard" turn-on and the ramp wave forms (pulsed sawtooth wave forms on pedestals) have linear slopes due to the particularly novel constant current characteristics of C-MOS solid state NAND circuit elements employed in their generation.

The apparatus is particularly adapted to AC induction motor starting control, but is also entirely suited for any analog programmed or manually controlled (at low level) operation for AC power varying control either intermittently or continuously.

The manner in which the invention is typically implemented will be evident as this description proceeds.

BRIEF DESCRIPTION OF THE DRAWINGS

FIG. 3 is a schematic of the drive power amplifier responsive to the circuits of FIG. 2;

FIG. 4 depicts voltage of the AC power and SCR gate signals generated in FIGS. 2 and 3;

FIG. 5 depicts the expanded first few microseconds of the SCR gate voltage generated in FIGS. 2 and 3;

FIG. 6 depicts SCR gate current into a one ohm load at the 180 degree conduction angle;

FIG. 7 depicts the first few microseconds of the waveforms of FIG. 6;

FIG. 8 is a schematic diagram of a typical reverse-parallel SCR arrangement for full-wave control of an AC load and is responsive to a pair of circuit channels according to FIGS. 2 and 3;

FIGS. 9(a), (b), (c), and (d) depict performance of various prior art induction motor starting apparatus;

FIG. 9(e) depicts induction motor starting characteristics of the device of the invention; and FIGS. 10(a)–10(g) illustrate various input and output waveforms in portions of the circuit of FIG. 2.

DESCRIPTION OF THE PREFERRED EMBODIMENTS

Figure 1:
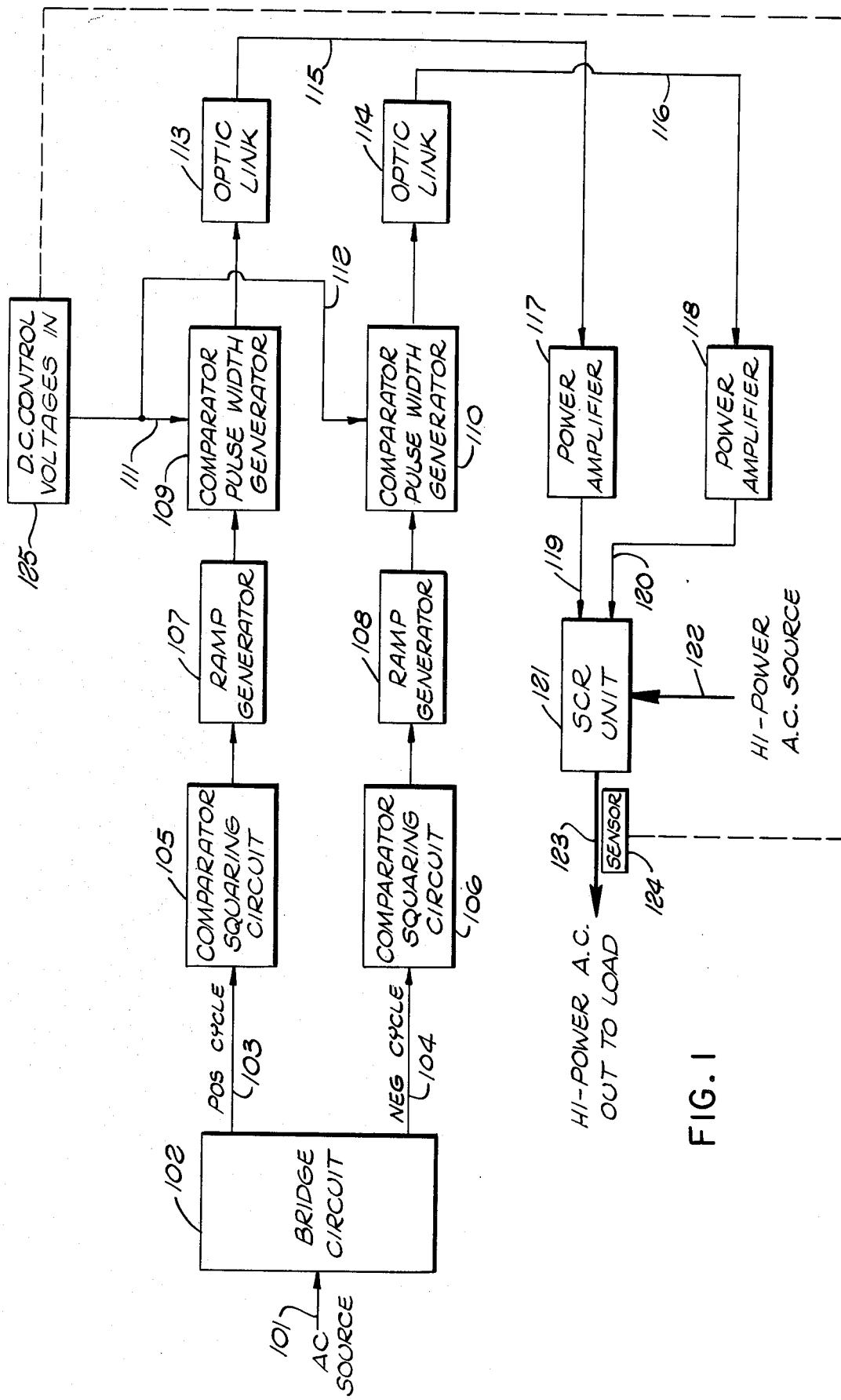
FIG. 1 is a functional block diagram of the device of the invention.

Referring now to FIG. 1, a block diagram of a system in accordance with the invention will be described. In FIG. 1, AC sources and power supply arrangements are omitted, however these will be described in connection with subsequent drawing figures.

An AC voltage source 101 is coupled to a fullwave bridge circuit 102. The AC voltage source is a reduced AC voltage taken from the same basic source as a high-power AC voltage source 122 coupled to an SCR unit 121, and accordingly is synchronous therewith. The bridge circuit 102 also serves to supply dc power to portions of the system of FIG. 1. However, the bridge circuit signal functions are of principal interest in FIG. 1. These functions include the provision of a pair of power frequency signals of the same polarity, but of 180 degree relative phase. The nature of electronic circuitry is such that the separate handling of each half cycle of the AC supply is necessary.

The SCR elements of the SCR unit 121 are in a reverse parallel arrangement for an AC output; that is, with the anode of each connected to the cathode of the other, so that one SCR is able to conduct on the positive half-cycle and the other on the negative half-cycle. Alternatively, should a dc output be desired, the configuration of the SCR's could be accordingly changed. Separated SCR gate control signals are obviously then required, and the circuits providing such signals effectively operate alternately, since one set of circuits handles the AC power circuit positive half-cycles and the other with the negative half-cycles.

Output signals from the bridge circuit 102 are coupled to comparator/squaring circuits 105 and 106 through output lines 103 and 104, respectively. The output signals are waveforms of the same polarity but of 180 degree phase relationship. Comparator/squaring circuits 105 and 106 operate with gain elements to convert the bridge signals to square waves. These square waves are used as signal gates for ramp generators 107 and 108 coupled to the output of comparator/squaring 105 and 106, respectively. Recalling that the square waves are in 180 degree phase relationship, the ramp waveforms from ramp generators 107 and 108 are similarly phase related, and each ramp waveform is in effect a sawtooth waveform on a controllable pedestal followed by a rest time. The description of detailed circuits to follow will further clarify this process.

The ramp waveforms from ramp generators 107 and 108 are coupled to comparator/pulse-width generators 109 and 110, respectively. The ramp waveforms are then compared to a control voltage 125 generated externally and applied at terminals 111 and 112 of the comparator/pulse-width generator, respectively. Gain elements are also used in comparator/pulse-width generators 109 and 110 so that, when the ramps cross this external reference voltage, the outputs of comparator/pulse-width generators 109 and 110 rise rapidly and saturate for the duration of the ramps beyond the crossover point. The outputs of comparator/pulse-width generators 109 and 110 are basically the SCR gate control signals as far as timing and duration are concerned.

It should be noted that, the farther along on each pulse ramp such cross-over occurs, the shorter will be the SCR gate and the later it initiates in the corresponding AC half-cycle. Accordingly, the SCR's fire at correspondingly later times in the AC half-cycles applied to the SCR anode-cathode main current paths and SCR outputs to a load provide correspondingly reduced RMS voltage and power. The SCR unit 121 contains the aforementioned reverse-parallel SCR pairs for this power control between power leads 122 and 123.

The output signals from comparator/pulse-width generators 109 and 110 are coupled to optical links 113 and 114, respectively. Optical links 113 and 114 are devices which convert electrical signals to optical signals and then back to electrical form at output leads 115 and 116, respectively. An optical fiber or link handles these signals in an electrically non-conducting medium. Such devices are employed where it is desired to reject a common mode voltage (sometimes high voltage), or in other words, to float the circuits following 113 and 114 electrically with respect to the preceeding circuits. The output leads 115 and 116 are coupled to power amplifiers 117 and 118, respectively. Power amplifiers 117 and 118 are coupled to the SCR unit 121 and provide sufficient drive for the SCR gate electrode. Additionally, a sensor 124 could be provided to measure KVA input to the load and, accordingly, adjust the dc control voltage to terminals 111 and 112 as indicated by the dashed line to maintain a desired KVA input level.

Figure 2:
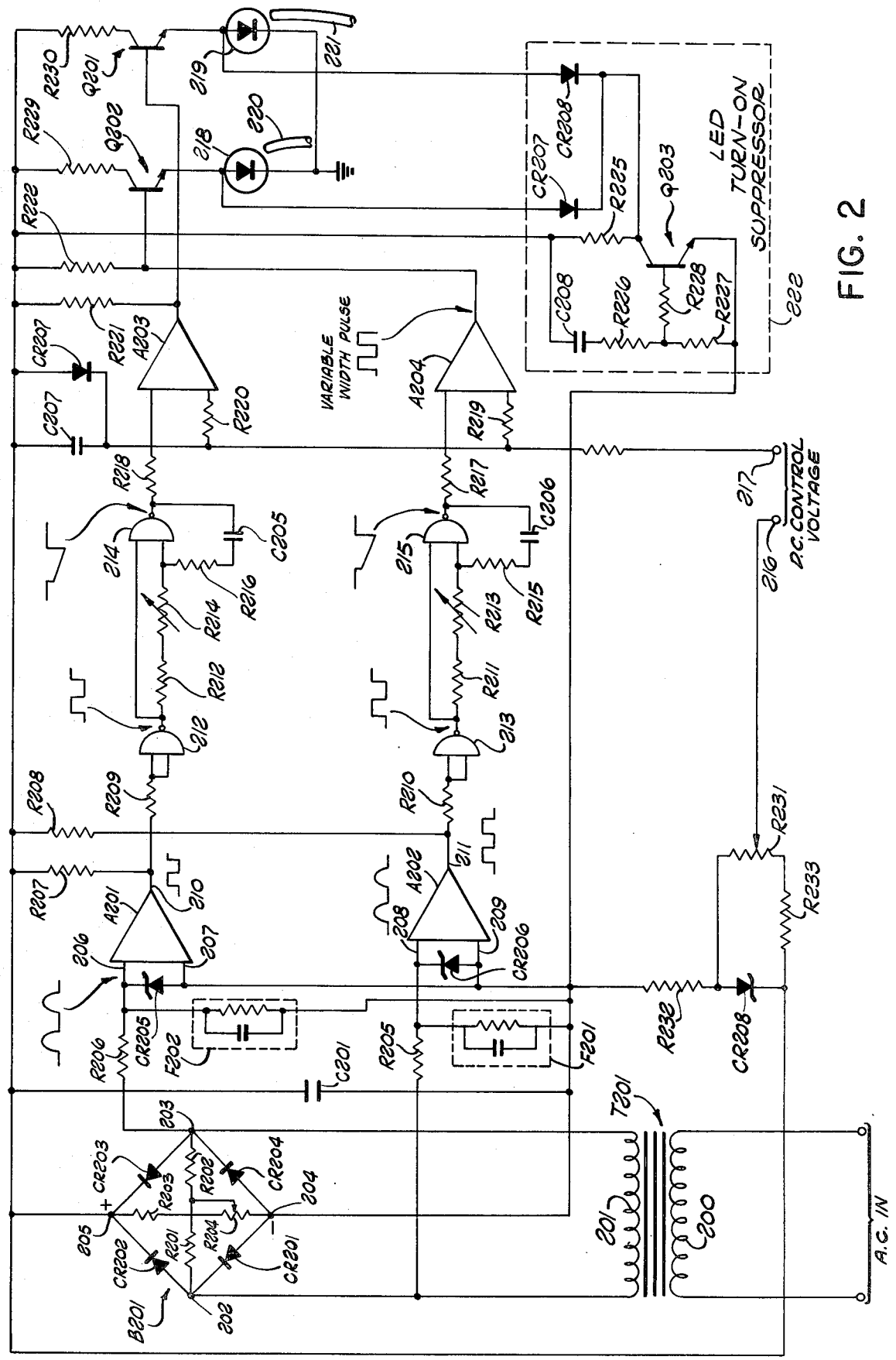
FIG. 2 is a schematic diagram of circuit for generating the variable SCR gate signals in apparatus of FIG. 1.

The circuits preceeding optical links 113 and 114 are depicted in detail in FIG. 2 along with the optical link input transducers. The output transducers of optical links 113 and 114 and circuits following are depicted in detail in FIG. 3. FIG. 1 illustrates the circuitry required for a single phase controller. Three phase control requires the same circuitry in triplicate.

Referring now to FIG. 2, it will be noted that a full wave diode bridge B 201 is energized at a reduced AC voltage through an isolation transformer T 201. The primary winding 200 of transformer T 201 is energized from the same basic AC source as the high voltage power to be controlled, and is therefore phase locked to it. The secondary voltage at the transformer secondary winding 201 may be in the order of 16 volts RMS, which provides adequate signal and dc operation outputs for the circuits.

It should be noted that diode bridge points 202 and 203 are excited by the secondary winding 201 AC voltage shown in FIG. 10(a). In view of the polarities of bridge diodes CR 201, CR 202, CR 203 and CR 204, a dc voltage is provided across bridge points 204 (negative) and 205 (positive), which also appears across a filter capacitor C 201, and becomes the dc energizing source for the circuits of FIG. 2.

The bridge circuit B 201 is used to provide alternate 180 degree phase relationship signals of the same polarity in addition to its dc power supply function for the circuit of FIG. 2. The bridge circuit B 201 includes a first output terminal 203 at the junction of the bridge diode pair CR 203 and CR 204 and a second output terminal 202 at the junction of bridge diode pair CR 201 and CR 202. The bridge output terminals 203 and 202 are each coupled to one input terminal of amplifier 206 and 208, respectively. Amplifiers 206 and 208 are standard operational amplifiers and have their other input terminals returned to the negative dc supply terminal 240 as shown. Zener diodes CR 205 and CR 206 are coupled across the amplifier A 201 and A 202 input terminals and prevent terminals 206 and 208 from going negative and limit their positive excursions to diode avalanche voltages.

The input signals across amplifiers A 201 and A 202, respectively, shown in FIGS. 10(b) and (c), are time-phase, 180 electrical degrees apart, and are of the same polarity. As can be seen, with a positive going signal at bridge terminal 203 and a negative going signal at bridge terminal 202 from the transformer secondary winding 201, positive half-cycle signals are applied to the amplifier A 201 input terminals through a path formed by amplifier terminal 206, resistor R 206, bridge terminal 203, transformer winding 201, diode CR 201, bridge terminal 204 and amplifier A 201 input terminal 207.

Similarly, with a positive going signal applied at bridge terminal 202 and a negative going signal at bridge terminal 203, positive half-cycle signals are applied to the amplifier A 202 input terminals through a path formed by amplifier input terminal 208, resistor R 205, transformer winding 201, bridge terminal 203, diode CR 204, bridge terminal 204 and amplifier input terminal 209.

Amplifiers A 201 and A 202 produce square waveforms, whose duty cycle is equal to the amplifier input signals, but which have a phse reversal as shown in FIG. 10 (d) and (e), respectively with respect to the signal at the amplifier input terminals.

Further, the pulse width of the amplifier input signals can be adjusted by a biasing network, the biasing network is formed of a network of resistors R 201, R 202, R 203 and R 204. Resistors R 203 and R 204 are connected in series across the energizing capacitor C 201. The resistors R 201 and R 202 are connected in series between bridge terminals 202 and 203. A tap at R 204 from the junction of resistors R 201 and R 202 enables adjustment of the dc level of the applied AC signals to the amplifiers A 201 and A 202. FIG. 10 (f) illustrates the input signal to amplifier input terminals 206 and 207, for an adjusted pulse width of greater than 180 degrees with FIG. 10 (g) illustrating the resultant square wave output waveform at amplifier A 201. The input and output waveforms of amplifier A 202 would be similarly shaped but, of course, would have a 180 degree phase relationship with respect to the input and output signals of amplifier A 201. Alternatively, the resistor network tap adjustment enables input and output waveforms of less than 180 degrees as well. The adjustable pulse width of greater than 180 degrees can be utilized to turn on the SCR's before the occurrence of the input AC voltage waveform such as for controlling a highly inductive load where there is a lag in the current waveform.

Further, filters F 201 and F 202 across the input terminals of amplifiers A 202 and A 201, respectively, eliminate line noise. In addition, the squaring of the input pulses by the amplifiers A 201 and A 202 also eliminate the effects of line noise and enable the SCR's to be turned on at low phase angles of input power, unlike prior art devices where line noise necessitates turn on only at high phase angles of input power.

The outlet terminals 210 and 211 are coupled through resistors R 209 and R 210 to common input terminals of NAND gates 212 and 213, respectively. The NAND gates are C-MOS elements which have an inherent input constant current characteristic. Gate 212 together with gate 214, and gate 213 together with gate 215, operate identically (in phase) which respective output signals from the amplifiers A 201 and A 202, respectively. Gate 212 acts as a driver and inverts the input squared pulses of FIG. 10(d). The output waveform of gate 212 is an inverted squared pulse [shown in FIG. 10(h)]. The constant current effect of gate 214 charges are capacitor C 205 through a current limiting resistor 212 and slope controlling resistor R 214 (variable for slope adjustment) periodically during the square wave "on time" amplifier of A 201. Resistor R 216 sets the pedestal amplitude (initial capacitor C 205 charge) so that an initial ramp signal amplitude may be selected. The resulting output gate of 214 of FIG. 10(i) is substantially linear negative-going peroidic sawtooth wave (ramp) on a small pedestal. The purpose of the pedestal is to commence the ramp signal below the power supply level as the comparator/pulse width generator will not effectively operate close to the power supply level.

The ramp signal output from gate 214 is compared to the dc input (reference) control signal applied between terminals 216 and 217 from an external source. An operational (differential) amplifier A 203 picks off the crossover point between the ramp outputs of gate 214 and the reference (control) voltage at terminals 216 and 217. It should be noted that this control voltage at terminals 216 and 217 is the independent variable which establishes the initial turn-on of the SCR gate, and is first established at the output of operational amplifier A 203. The SCR gate pulse at the output of amplifier A 203 may be varied from a few microseconds up to substantially the full ramp duration of slightly more than 8.2 milliseconds (for the 60 cycle case) for highly inductive loads as previously mentioned, depending upon the adjustment of the control voltage at terminals 216 and 217 for late or early cross-over and the pulse width of the signals into the amplifier A 201 and A 202.

The operational amplifier A 203 output is coupled through a transistor Q 201 to the optical link comprising a light-emitting diode LED 219 and an optical coupler 221 (fiber optic element preferably) and then to the photo-transistor which is illustrated in FIG. 3. This coupling provides for floating or re-referenced voltage levels and is necessary because the power amplifier to follow is necessarily referenced to operating potentials of the SCR's themselves. All of the circuits of FIG. 2 operate at low voltage, the signals being a few volts maximum. The transistor Q 201 acts as a switch for light-emitting diode LED 219, responding to the amplifier A 203 output.

The circuit 222 shown in broken lines prevents a spurious signal from turning on the SCR's during initial circuit turn-on which could result in the destruction of the SCR's. The circuit comprises a transistor Q 203 which effectively clamps diodes CR 207 and CR 208 until capacitor C 208 charges sufficiently to bring the collector of transistor Q 203 to a point releasing the clamp of the diodes CR 207 and CR 208 and, therefore, of the light-emitting diodes LED 217 and 218 during initial turn-on. Base divider resistors R 226 and R 227 and collector load resistor R 225 are selected in accordance with the requirements of transistor Q 203. Capacitor C 208 is only large enough to provide a time constant sufficient to protect against the turn-on of light-emitting diodes 218 and 219 for a few cycles initially.

A reference voltage to terminal 216 is taken from a tap on resistor R 231 which is in series with resistor 233 across a voltage stabilizing zener diode 208. Resistor 232 acts as the current limiting resistor.

The operation of the second "channel" of FIG. 2 will be realized to be the same as that described. That is, amplifier A 202 operates identical with amplifier a 201 and amplifier A 204 identically with amplifier A 203. Similarly, the NAND gates 213 and 215 duplicate the functions of NAND gates 212 and 214, respectively, and resistors R 211, R 213, R 215 and capacitor C 206 duplicate the functions of resistors R 212, R 214, R 216 and capacitor C 205, respectively.

Resistor R 207 and R 208 are operational amplifier load resistors for amplifiers A 201 and A 202, respectively, and each of those amplifiers has an RC input filter F 202 and F 201 for removing transients passed on by the bridge circuit at terminals 203 and 202, respectively.

Current limiting resistors R 209 and R 210 participate in the constant current ramp formation in the NAND gate circuit ramp generator described. It will be evident that the C-MOS NAND gates are not employed in a conventional use for such circuits, but rather are exploited as a simple, constant-current gated charging arrangement for capacitors on which the substantially linear ramps described are developed.

Resistors R 218 and R 217 provide current limiting into the ramp signal inputs of amplifiers A 203 and A 204, respectively. Resistors R 221 and R 222 are obviously load resistors for amplifiers A 203 and A 204, respectively, and resistors R 229 and R 230 limit the collector-emitter current of transistors Q 202 and Q 201, respectively, in connection with the gating of the light emitting diodes LED 218 and LED 219.

The output of the circuits of FIG. 2 are light domain gates which have the duration of the SCR gates in final form, these being restored to the electrical signal domain in FIG. 3.

Referring now to FIG. 3, the power amplifier components 117 and 118 of FIG. 1 is illustrated. Whereas FIG. 2 illustrates the block diagram of FIG. 1 up to the optical links 113 and 114 as illustrated in FIG. 1, a pair of amplifier circuits according to FIG. 3 is required to separately, fulfill the requirement for power amplifiers 117 and 118.

In FIG. 3, the optical fiber 220 (or 221) of FIG. 2 is duplicated. The photo-transistor Q 301 responds to the light gate signal from optical fiber 220 or 221 and produces a new electrical signal at terminal 305, having the same duration as the light signal through the optical fiber.

A diode CR 301 establishes emitter bias (reference level) for both photo-transistor Q 301 and a transistor Q 302. The photo-transistor Q 301 is in a normal (quiescent) off or non-conducting condition, however the light signal from optic fiber 220 or 221 causes it to conduct providing a signal to transistor Q 302 by emitter-to-emitter coupling. Resistors R 301, R 302, and R 303 form a biasing network for the base of transistor Q 302, resistor R 304 being the collector load resistor for transistor Q 302. The signal at terminal 305 rises rapidly when photo-transistor Q 301 conducts, transistor Q 302 being normally conducting, but biased toward non-conducting by the photo-transistor Q 301 output pulse. Non-conduction of transistor Q 302 causes the instantaneous turn-on of diode CR 302, which causes a turn-on signal at the base of transistor Q 305, the SCR gate main power driving transistor. Resistor R 308 is the transistor Q 305 load resistor and operates to maintain the stability of transistor Q 305 when an output terminal 307 is disconnected for any reason. Transistor Q 304 acts as a hold off for transistor Q 305, but provides drive to the base of transistor Q 305 at point 306 in response to the collector signal of transistor Q 301 at junction 303 directly through base current limiting resistor R 305.

During the quiescent time of transistor Q 305, capacitor C 301 charges toward the positive supply terminal through resistor R 307. The charge of capacitor C 301 is dumped through the collector-emitter main current carrying path of transistor Q 305 when transistor Q 305 is pulsed into conduction. The result is an initial spike on the output waveform at terminal 307 (with respect to the return terminal 308). Subsequently, but before transistor Q 305 is again biased off by current through the emitter-collector path of transistor Q 304, a holding current of the SCR gate is in existance at terminal 307 (shown at 403 in FIG. 4).

Operation of transistor Q 305 produces an average drop across resistor R 307 which activates diode 303, which is an LED used only for visual confirmation of operation of the SCR gates up to and through transistor Q 305. Resistor R 309 operates as a current limiter for the diode 303.

The AC source at winding 301 need not be synchronous with the main AC power, and transformer T 301 reduces its voltage at 15 volts RMS +/− across secondary winding 302. This transformer also preserves the voltage isolation of the entire FIG. 3 circuit so that it can "float" with the SCR gates. The diode bridge consisting of diodes CR 303, CR 304, CR 305 and CR 306 produces full-wave rectification and charges filter capacitor C 302 to a positive voltage (corresponding to bridge terminal 309), a negative bridge terminal 310 being in parallel with the other lead of capacitor C 302.

The output terminals 307 and 308 provide the SCR gate signals of controlled duration, as explained, in sufficient power to drive the SCR gate electrodes directly.

FIG. 8 shows the reverse parallel SCR pair required to drive a signal phase load (or switch one phase of a polyphase source to one phase of the polyphase load). The SCR's, of course, could also be arranged to provide controlled dc voltage from an AC source. The two SCR's CR 801 and CR 802 operate on the main power positive-going and negative-going half cycles, respectively, hence the reverse parallel connection. The SCR gates 801 and 802 then operate to control these SCR's during the corresponding AC half cycles, each being driven from the terminals 307 of an amplifier of the type shown in FIG. 3. The terminals 308 would be connected to corresponding SCR cathodes.

Referring now to FIGS. 4, 5, 6, and 7, some significant waveforms with typical relative amplitudes resulting from operation of the apparatus of the invention are depicted.

FIG. 4 depicts typical time relationship between SCR anode-to-cathode voltage and the spiked gate signal for the SCR. The waveform 401 could be either half cycle of the AC main power. The SCR gate signal consists of a hard turn-on spike 402 and a conduction maintenance valve 403. The reduction of SCR stress through use of a "hard turn-on" has been previously explained. The spike 402 of the SCR gate voltage will, of course, move to the right on FIG. 4 as the conduction angle is decreased as a function of the external control voltage described in connection with FIG. 2. In a typical motor starting situation, the initial SCR gate would be relatively short, the spike 402 being substantially to the right, the duration from 402 to the end of 403 being shorter overall.

FIG. 5 is an expanded view of the SCR gate voltage over the first few microseconds (for the 180 degree conduction angle case).

FIG. 6 is an SCR gate current plot over the same time base as FIG. 4 for the 180 degree conduction angle case. The gate impedance (effective resistance) is taken at a typical one ohm for current calculations in FIG. 6.

FIG. 7 is an expanded time base current plot (first few microseconds) for the 180 degree conduction angle case.

FIG. 9(a) through 9(d) are self-explanatory comparative performance curves for typical prior art induction motor starting devices, and FIG. 9(e) depicts the same data for a typical induction motor starter according to the invention. Note the relatively level KVA and torque program.

It will be realized that the programming (or manual development) of the control voltage applied to the comparators of FIG. 2 must be selected to match the characteristics of a particular motor. Thus, a timed (ramp or otherwise) control voltage generator is appropriate for that function, which would be expected to be different for each motor or other apparatus controlled by the device of the invention. Additionally, a sensor circuit could be provided to sense the KVA input to the AC load and, accordingly, adjust the dc control voltage to the comparator/pulse width generator to maintain a constant KVA input to the load. The sensor could be a current transformer, whose output is a function of KVA, and which in turn could be used to modify the control voltage ramp valve as indicated by the dashed line.

I claim:

1. A power control system comprising:
   first means including at least one SCR solid state switch device connected with its main current carrying path in series between a source of AC power and a load;
   second means for generating an SCR gate signal for firing of said SCR, said gate signal occurring in synchronism only during one half cycle of said AC power source having a duration which is variable in response to a characteristic of an externally generated control signal;
   and third means with said second means for generating a series of signal ramp waves, said ramp waves each being synchronous with a corresponding AC power half cycle, said third means generating said signal ramp as a substantially linear voltage ramp and said value of said externally generated control signal is its voltage at time of crossing, said third means further comprising means for generating a substantially square wave signal corresponding to one of the positive and negative half waves of said AC source, a capacitor charge circuit also including a solid state device exhibiting a substantially initial constant current characteristic, said circuit providing said square wave signals through said solid state device for substantially constant current charging of said capacitor during each of said square waves to provide said linear voltage ramp and means for providing a pedestal amplitude for said linear voltage ramp;
   fourth means within said second means comprising a comparator for generating a series of said SCR gate signals when the instantaneous value of said signal ramp crosses over the value of said externally generated control signal at the time of said crossing;
   and fifth means for applying said SCR gate signals to said SCR switch device to control the fraction of each AC cycle which causes current to flow in said SCR main current carrying path.

2. Apparatus according to claim 1 in which said fifth means comprises a power amplifier.

3. Apparatus according to claim 1 in which said solid state device is a NAND gate of the CMOS type.

4. An AC power controller for providing full wave power control in response to an externally generated control signal and in which at least one pair of SCR solid state switching elements is connected with anode-cathode main current carrying paths in parallel in reverse polarities between a source of AC power and a load, comprising:
   first means connected to said AC source for driving first and second trains of signals of the same polarity, said first train of signals being synchronous with the positive half cycles of said AC source and said second source and said second train of signals being synchronous with said negative half-cycle of said AC source, a full-wave diode bridge connected to said AC source at first and second opposite terminals thereof and providing signals from said terminals thereof, which are said first and second signal trains of the same polarity;
   second means comprising a pair of squaring circuits each responsive to one of said trains of signals to produce corresponding first and second substantially square wave signal trains;
   third means responsive to said second means for producing first and second trains of signal ramps each synchronous and contemporaneous with a corresponding one of said square wave signal trains comprising separate first and second voltage ramp generators responsive to said first and second square wave trains from said second means, respectively, said ramp generators each comprising a capacitor and a solid state device having a substantially constant circuit characteristic, said capacitor being connected in a charge circuit for producing said signal ramps as substantially linear voltage ramps beginning with the leading edge of the individual square waves of said square wave trains and extending at least to the trailing edge of each of said square waves and means for providing a pedestal amplitude for said signal ramps;
   fourth means for continuously comparing said first and second trains of signal ramps to the amplitude of said externally generated control signal to produce separate first and second SCR gates beginning substantially at the time of cross-over of the instantaneous amplitude of each of the corresponding ramps and said externally generated control signal, said SCR gates thereby varying in duration as a function of said externally generated control signal amplitude; and
   fifth means for applying said sequence SCR gates each to a corresponding one of said SCR devices to provide said full wave control of the power passing through said SCR main current carrying paths.

5. Apparatus according to claim 4 in which said fourth means comprises first and second differential amplifiers having first and second input terminals responsive to said first and second trains of signal ramps from said third means, respectively, at their corresponding first terminals and to said externally generated control signal, said externally generated control signal having a range of values substantially the same as the range of instantaneous values of said ramp signals, and in which said fourth means also comprises means responsive to said first and second differential amplifier outputs to initiate the corresponding ones of said SCR gate signals substantially at the times of instantaneous equality of said externally generated control signal and the corresponding ramp signal.

6. Apparatus according to claim 4 in which said fifth means comprises first and second power amplifiers responsive to said first and second SCR gates generated by said fourth means.

7. Apparatus according to claim 4 in which said fifth means comprises an electric signal-to-light transducer responsive to each of said SCR gates, a light-to-electric signal transducer and optical means coupling said transducers to produce said SCR gates in isolated form, whereby the circuits of said fifth means may be electrically isolated from said fourth means to accommodate high load and source voltages.

8. Apparatus according to claim 4 in which electrically isolating means are included for coupling said fourth and fifth means to isolate said first, second and third and fourth means may be isolated from said load and source voltages extant at said SCR's.

9. Apparatus according to claim 4 in which said fifth means comprises means for providing a firing spike on the leading edge of each of said SCR gates.

10. An AC power controller for providing full wave power control in response to an externally generated control signal and in which at least one pair of SCR solid state switching elements is connected with anode-cathode main current carrying paths in parallel in reverse polarities between a source of AC power and a load, comprising:

first means connected to said AC source for driving first and second trains of signals of the same polarity, said first train of signals being synchronous with the positive half cycles of said AC source and said second source and said second train of signals being synchronous with said negative half-cycle of said AC source, a full-wave diode bridge connected to said AC source at first and second opposite terminals thereof and providing signals from said terminals thereof, which are said first and second signal trains of the same polarity;

second means comprising a pair of squaring circuits each responsive to one of said trains of signals to produce corresponding first and second substantially square wave signal trains and further comprising a separate amplifier responsive to each of said first means trains, said amplifier providing sufficient gain to steepen the rise and fall times of the waves of said trains and being adapted to saturate for flattening said signal tops to produce said corresponding first and second square wave signal trains;

third means responsive to said second means for producing first and second trains of signal ramps each synchronous and contemporaneous with a corresponding one of said square wave signal trains comprising separate first and second voltage ramp generators responsive to said first and second square wave trains from said second means, respectively, said ramp generators each comprising a capacitor and a solid state device having a substantially constant current characteristic, said capacitor being connected in a charge circuit for producing said signal ramps as substantially linear voltage ramps beginning with the leading edge of the individual square waves of said square wave trains and extending at least to the trailing edge of each of said square waves and means for providing a pedestal amplitude for said ramps;

fourth means for continuously comparing said first and second trains of signal ramps to the amplitude of said externally generated control signal to produce separate first and second SCR gates beginning substantially at the time of cross-over of the instantaneous amplitude of each of the corresponding ramps and said externally generated control signal, said SCR gates thereby varying in duration as a function of said externally generated control signal amplitude; and fifth means for applying said separate SCR gates each to a corresponding one of said SCR devices to provide said full wave control of the power passing through said SCR main current carrying paths.

11. Apparatus according to claim 10 in which said fourth means comprises first and second differential amplifiers having first and second input terminals responsive to said first and second trains of signal ramps from said third means, respectively, at their corresponding first terminals and to said externally generated control signal, said externally generated control signal having a range of values substantially the same as the range of instantaneous values of said ramp signals, and in which said fourth means also comprises means responsive to said first and second differential amplifier outputs to initiate the corresponding ones of said SCR gate signals substantially at the times of instantaneous equality of said externally generated control signal and the corresponding ramp signal.

12. Apparatus according to claim 11 in which said fifth means comprises first and second power amplifiers responsive to said first and second SCR gates generated by said fourth means.

13. Apparatus according to claim 12 in which said fifth means comprises an electric signal-to-light transducer responsive to each of said SCR gates, a light-to-electric signal transducer and optical means coupling said transducers to produce said SCR gates in isolated form, whereby the circuits of said fifth means may be electrically isolated from said fourth means to accommodate high load and source voltages.

14. Apparatus according to claim 13 in which said electric-to-light transducers are light emitting diodes, said light-to-electric transducers are photo transistors, and said means optically coupling said transducers is an electrically insulating but light conducting medium.

15. Apparatus according to claim 14 in which said fifth means comprises means for providing an immediate firing spike and subsequent holding current on the leading edge of said SCR gates comprising a normally non-conductive photo-transistor and a normally non-conductive output switch, said normally non-conductive output switch being conductive immediately open conduction of said normally non-conductive phototransistor.

16. A ramp generator for producing an output sawtooth signal in response to a square wave pulse input signal comprising:
   a first and second NAND gate each having a first and second input terminal and an output terminal;
   means for coupling the input square wave pulse to the input terminals of said first NAND gate;
   means for coupling the first NAND gate output terminal to said second NAND gate first input terminal;
   a charging capacitor coupled between said second NAND gate output terminal and said second NAND gate second input terminal, and a slope control resistor coupled between said first NAND gate output terminal and said second NAND gate second input terminal for controlling the slope of said output sawtooth signal generated at said second NAND gate output terminal and a resistor connected in series with said charging capacitor for controlling the initial ramp amplitude of said sawtooth signal.

17. A ramp generator in accordance with claim 16 wherein said NAND gate is of the C-MOS type having an inherent input constant current characteristic.

18. Circuit means for providing variable pulse width power frequency signals of the same polarity but of 180 degree relative phase from a full-wave input signal comprising;
   a diode bridge formed of two pairs of series connected diodes;
   means for coupling said full-wave input signal across the junction of each pair of said series connected diodes;
   means for coupling one of said power frequency signals from each of said junctions; and means for adjusting said power frequency signal pulse width while retaining said relative phase comprising a biasing network coupled to said junctions.

19. An AC power controller for providing full wave power control in response to an externally generated control signal and in which at least one pair of SCR solid state switching elements is connected with anode-cathode main current carrying paths in parallel in reverse polarities between a source of AC power and a load, comprising:
   first means connected to said AC source for driving first and second trains of signals of the same polarity, said first train of signals being synchronous with the positive half cycles of said AC source and said second source and said second train of signals being synchronous with said negative half-cycle of said AC source, a full-wave diode bridge connected to said AC source at first and second opposite terminals thereof and providing signals from said terminals thereof, which are said first and second signal trains of the same polarity, said full-wave diode bridge including a resistor tap network for providing signals at said AC source first and second opposite terminals whose pulse width vary from 180° retaining the relative phase;
   second means comprising a pair of squaring circuits each responsive to one of said trains of signals to produce corresponding first and second substantially square wave signal trains;
   third means responsive to said second means for producing first and second trains of signal ramps each synchronous and contemporaneous with a corresponding one of said square wave signal trains;
   fourth means for continuously comparing said first and second trains of signal ramps to the amplitude of said externally generated control signal to produce separate first and second SCR gates beginning substantially at the time of cross-over of the instantaneous amplitude of each of the corresponding ramps and said externally generated control signal, said SCR gates thereby varying in duration as a function of said externally generated control signal amplitude; and
   fifth means for applying said separate SCR gates each to a corresponding one of said SCR devices to provide said full wave control of the power passing through said SCR main current carrying paths.

* * * * *